(12) United States Patent
Ido et al.

(10) Patent No.: US 6,362,514 B1
(45) Date of Patent: Mar. 26, 2002

(54) SEMICONDUCTOR DEVICE

(75) Inventors: Yasuhiro Ido; Takeshi Iwamoto; Rui Toyota, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/352,340

(22) Filed: Jul. 13, 1999

(30) Foreign Application Priority Data

Jan. 19, 1999 (JP) .......................................... 11-010647

(51) Int. Cl.⁷ ................................................ H01L 29/00
(52) U.S. Cl. ........................ 257/529; 257/173; 257/665; 257/910; 257/530; 438/132; 438/215; 438/281; 438/467; 438/601; 438/636; 438/661; 438/678; 438/333
(58) Field of Search ........................ 257/529, 758–762, 257/173, 665, 910, 530; 438/132, 215, 281, 467, 601, 333, 636, 661, 678

(56) References Cited

U.S. PATENT DOCUMENTS 4,935,801 A * 6/1990 McClure et al. ............... 357/51
5,321,300 A * 6/1994 Usuda et al. ................ 257/529
5,589,706 A    12/1996 Mitwalsky et al.
5,986,319 A * 11/1999 Huggins ..................... 257/529

FOREIGN PATENT DOCUMENTS

JP            9-17960           1/1997

* cited by examiner

*Primary Examiner*—Tom Thomas
*Assistant Examiner*—Donghee Kang
(74) *Attorney, Agent, or Firm*—McDermott, Will & Emery

(57) ABSTRACT

There is described a semiconductor device having a copper fuse which prevents damage to a silicon substrate beneath the copper fuse, which would otherwise be caused by a laser beam radiated to blow the copper fuse. A light absorbing layer is formed on the copper fuse layer from material whose light absorption coefficient is greater than that of a copper wiring layer. Light absorbed by the light absorbing layer is transmitted, through heat conduction, to the copper wiring layer beneath the light absorbing layer and further to a barrier metal layer beneath the copper wiring layer. Even when the widely-used conventional laser beam of infrared wavelength is used, the copper fuse can be blown. Since a guard layer is formed below the fuse layer, there can be prevented damage to the silicon substrate, which would otherwise be caused by exposure to the laser beam of visible wavelength. Therefore, the copper fuse can be blown even by use of a laser beam of visible wavelength whose light absorption coefficient for copper is high.

6 Claims, 10 Drawing Sheets

5 : second dielectric layer
6 : laser light

1 : silicon substrate
2 : first dielectric film
3 : fuse layer
3 a : barrier metal layer
3 b : copper wiring layer 4 : light absorbing layer 5 : second dielectric layer
6 : laser light 1 : silicon substrate
2 b : first dielectric film 2
7 : guard layer
7 a : barrier metal layer
7 b : copper wiring layer 2 : first dielectric layer
2 a : first dielectric layer 1
3 : fuse layer
3 a : barrier metal layer
3 b : copper wiring layer
5 : second dielectric layer
6 : laser light 3 : fuse
3 1 : main memory cell
3 2 : backup memory cell
3 3 : switching circuit 1 : silicon substrate
2 : first dielectric film
3 : fuse layer
3 a : barrier metal layer
3 b : copper wiring layer
5 : second dielectric layer
6 : laser light 12 : space 15 : blow pocket spectral light-absorption characteristic of copper and aluminum 41 : visible wave length (from 0.38 μm to 0.76 μm)
42 : infrared wave length

SEMICONDUCTOR DEVICE

BACKGROUND OF THE INVENTION

1. Field of the Invention

The present invention relates to a semiconductor device, and more particularly, to a semiconductor device which utilizes a copper wiring layer as a fuse suitable for use with a laser beam having a wavelength in the infrared range or the visible range.

2. Description of Related Art

A semiconductor device including a semiconductor substrate and a plurality of memory cells mounted thereon has conventionally comprised main memory cells and spare cell memories included within the memory cell region for the sake of providing redundancy. In the event that a portion of the memory cell does not operate properly for reasons of mixing of foreign articles into a semiconductor device during the course of manufacture, the backup memory cell is used in place of the inoperative portion (i.e., a defective memory cell) of the memory.

FIG. 9 shows the configuration of the semiconductor device having the spare cell memory. In FIG. 9, reference numeral 31 designates a main memory cell; 32 designates a backup memory cell (hereinafter referred to as "spare cell memory") provided beforehand in the memory cell region; 33 designates a switching circuit for switching an unillustrated defective memory cell in the main cell 31 to the spare cell memory 32; and 3 designates a fuse for programming the switching circuit 33 through opening. First, the address of the defective memory cell in the main cell 31 is detected through use of test equipment. The fuse 3 connected to the switching circuit 33 is opened by means of a laser beam, thereby programming the switching circuit 33 so as to substitute the spare cell memory 32 for the defective memory cell. More specifically, a word line, or the like, connected to the defective memory cell is disconnected, and the spare cell memory 32 is arranged so as to be selected when the address of the defective memory cell (i.e., a defective address) is selected.

The structure of the fuse 3 and the principle according to which the fuse layer 3 is opened by a laser beam will now be described by reference to FIGS. 10 through 13.

FIG. 10 is a plan view of the fuse 3. Opposite ends of the fuse 3 are connected to the interior of the respective switching circuits 33. The fuse 3 is opened by irradiation of its center portion 10 with a laser beam (radiated from above; i.e., perpendicular to, the sheet of FIG. 10). FIG. 11 is a cross-sectional view of the fuse 3 in its transverse direction (along line A1–A2 shown in FIG. 10). In FIG. 11, the fuse layer 3 is formed on a silicon substrate 1 by way of a first dielectric film 2. The fuse layer 3 comprises a barrier metal layer 3a and a copper wiring layer 3b formed thereon. A second dielectric film 5 is formed on the fuse layer 3. When the fuse layer 3 is exposed to a laser beam 6, the laser beam 6 is absorbed by the fuse layer 3, which consequently increases in temperature. As a result, the fuse layer 3 is changed in phase from a solid to a liquid and further to a vapor. As shown in FIG. 12, as a result of the changes in phase of the fuse layer 3, the bottom of the second dielectric film 5 is raised by the vapor pressure stemming from evaporation of the fuse layer 3, thereby forming a space 12. As shown in FIG. 13, when the vapor pressure within the space 12 exceeds a predetermined value, the fuse layer 3 is opened, the area of the second dielectric film 5 situated above the fuse layer 3 is blown, thus forming a blow pocket 15. If no second dielectric film 5 used for forming the space 12 for the purpose of withstanding a predetermined vapor pressure is provided, the fuse layer 3 is merely fused. Consequently, opening the fuse under the foregoing method involves the second dielectric film 5 used for blowing the fuse layer 3. A desirable thickness of the second dielectric film 5 is 0.4 to 1.0 μm or thereabouts.

A laser of infrared wavelength has conventionally been used to generate the laser beam 6 that is used for opening the fuse layer 3, in consideration of sufficient absorption of light by the fuse layer 3 and preventing the laser 6 from damaging the silicon substrate 1 underlying the fuse layer 3. For example, a Yttrium Lithium Fluoride (YLiF$_4$) YLF laser having a wavelength of 1.047 μm or 1.321 μm is widely used.

Recently, an increase in the number of layers of elements constituting a semiconductor device and an increase in film thickness stemming from a reduction in the number of processes for manufacturing a semiconductor device render more difficult disconnection of the fuse layer that is provided as a lower layer. For this reason, adoption of a wiring layer which is positioned at the highest possible position has recently become popular.

A metal wiring layer, for example, a copper wiring layer, is adopted as an upper wiring layer. An explanation is now given of a case where the copper wiring layer is used as a fuse layer.

FIG. 14 is a graph showing the spectral light-absorption characteristic of copper and aluminum, wherein the vertical axis represents a reflectivity R(%) and the horizontal axis represents a wavelength λ(μm). As shown in FIG. 14, the infrared wavelength 42 generally designates a wavelength λ of more than 0.76 μm, and the visible wavelength 41 generally designates a wavelength λ ranging from 0.38 to 0.761 μm. A laser beam of the infrared wavelength 42 has high reflectivity R with respect to copper present in a copper wiring layer forming a fuse layer. Consequently, a light absorption coefficient for copper (=1−R) is as low as several percent. Thus, the fuse cannot sufficiently absorb the laser and is considered to be difficult to open. Copper has a low reflectivity R relative to the visible wavelength 41, particularly light whose wavelength is shorter than a green wavelength of 0.57 μm. Therefore, copper has a high light absorption coefficient for visible light. Further, the silicon substrate 1 underlying the copper fuse has also a high light absorption coefficient for the laser of visible wavelength 41, relative to that for the laser of infrared wavelength 42. In a case where the copper fuse is opened through use of a laser beam of visible wavelength 41 whose absorption factor for copper is large, a laser beam of visible wavelength 41 radiated to open the copper fuse damages the silicon substrate 1.

As mentioned previously, when the copper fuse is opened through use of the laser beam of visible wavelength whose absorption coefficient for copper is large, the laser beam of visible wavelength radiated so as to open the copper fuse damages the silicon substrate underlying the copper fuse.

SUMMARY OF THE INVENTION

The present invention has been conceived to solve the foregoing problem, and the object of the present invention is to provide a semiconductor device having a fuse whose structure mitigates damage to the silicon substrate underlying the copper fuse through exposure of the copper fuse to a laser beam.

According to a first aspect of the present invention, there is provided a semiconductor device comprising: a semiconductor substrate; a first dielectric film formed on the semiconductor substrate; and a second dielectric film formed on the first dielectric film, wherein the first dielectric film has a fuse layer in a part of the area on the first dielectric film, the fuse layer including a copper wiring layer and the second dielectric film has a light absorbing layer located on the fuse layer, and the light absorbing layer is formed such that the absolute value of a real number term of a complex dielectric constant of the light absorbing layer is smaller than the absolute value of a real number term of a complex dielectric constant of the copper wiring layer and such that an imaginary number term of the complex dielectric constant of the light absorbing layer is greater than an imaginary number term of a complex dielectric constant of the copper wiring layer.

According to a second aspect of the present invention, there is provided a semiconductor device comprising: a semiconductor substrate; a first dielectric film formed on the semiconductor substrate; and a second dielectric film formed on the first dielectric film, wherein the second dielectric film includes a first wiring layer in a portion of the second dielectric film, the first wiring layer having a predetermined light absorption coefficient and the first dielectric film has a second wiring layer located beneath the first wiring layer, the second wiring layer having a light absorption coefficient which is not greater than a light absorption coefficient of the first wiring layer.

The above and other objects, effects, features and advantages of the present invention will become more apparent from the following description of the embodiments thereof taken in conjunction with the accompanying drawings.

DETAILED DESCRIPTION OF THE PREFERRED EMBODIMENTS

Figure 1A:
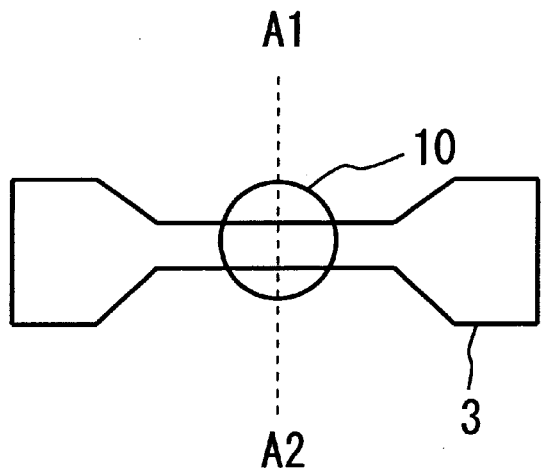
FIGS. 1A and 1B show the configuration of a semiconductor device according to a first embodiment of the present invention.

Embodiments of the present invention will be described below with reference to the accompanying drawings. It is noted that the same reference symbols in the drawings denote the same or corresponding components.

Embodiment 1

Device Configuration

Figure 1B:
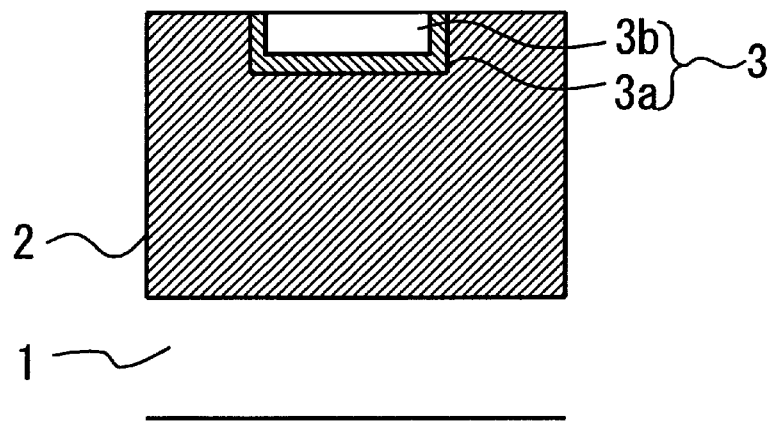

FIGS. 1A and 1B show the configuration of a semiconductor device according to a embodiment 1 of the present invention. FIG. 1A is a plan view of a fuse. In FIG. 1A, reference numeral 3 designates a fuse layer, and opposite ends of the fuse layer 3 are connected to the interior of respective unillustrated switching circuits which switch a defective memory cell to a spare cell memory. The fuse layer 3 is opened when its center 10 is exposed to a laser light (radiated from above the sheet of FIG. 1A). FIG. 1B is a cross-sectional view taken along a transverse direction of the fuse 3 (i.e., along line A1–A2 shown in FIG. 1A) [Each of FIGS. 2 through FIG. 8 is a cross-sectional view taken along a transverse direction of a fuse 3]. In FIG. 1B, the fuse layer 3 is formed on the silicon substrate (i.e., a semiconductor substrate) 1 by way of the dielectric film 2. The fuse layer 3 is formed from the barrier metal layer 3a and the copper wiring layer 3b formed thereon, through Damascene processes.

Figure 2:
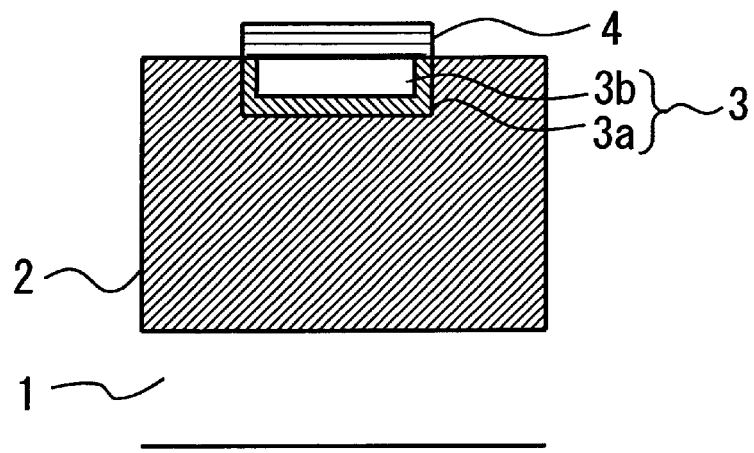
FIG. 2 shows the wafer in which a light absorbing layer has been formed on the copper wiring layer.
Figure 3:
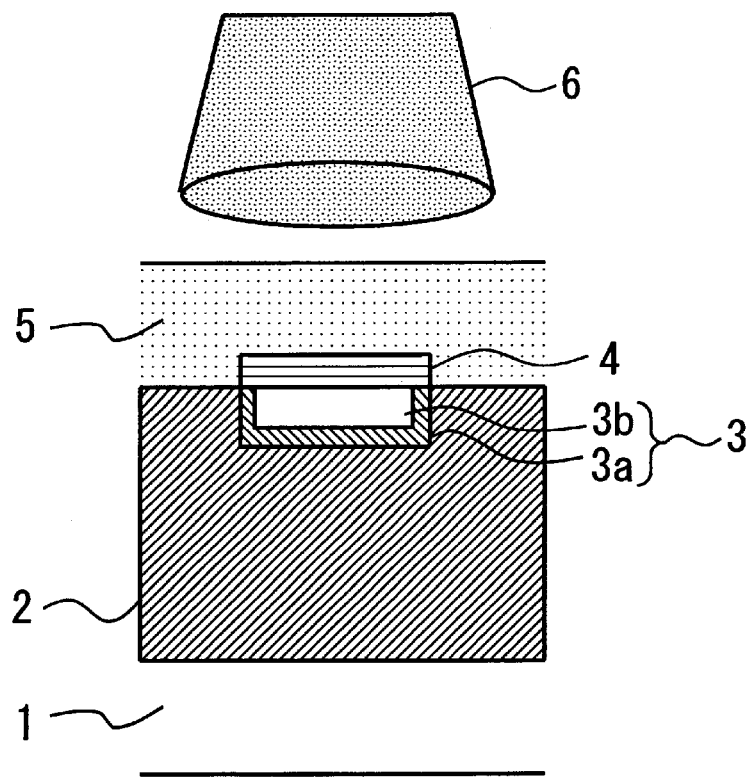
FIG. 3 shows a second dielectric film formed over the light absorbing layer and the first dielectric film.

FIG. 2 shows the wafer in which a light absorbing layer 4 has been formed on the copper wiring layer 3. As shown in FIG. 2, the light absorbing layer 4 for absorbing laser light is provided only on the area above the copper wiring layer 3b. As shown in FIG. 3, the second dielectric film 5 is formed over the light absorbing layer 4 and the first dielectric film 2.

The material used for the light absorbing layer 4 is now described. Physical constants which affect the light-absorbing characteristics of a "k" represents an extinction coefficient). Light is a form of electromagnetic radiation. If the complex refractive index "m" is converted into a complex dielectric constant $\epsilon$, a real number term $\epsilon_R$ of the complex dielectric constant $\epsilon(=\epsilon_R-i\epsilon_i)$ corresponds to a difference of the squares $(=n^2-k^2)$ of the real number term of the complex refractive index "m" and the extinction coefficient "k," which is an imaginary number term. The imaginary number term $\epsilon_i$ corresponds to a value $(=2nk)$ which is twice the product of the extinction coefficient "k" and an ordinary refractive index "n," which is the real number term of the complex refractive index "m." The absolute value of the real number term $\epsilon_R$ of the complex dielectric constant "$\epsilon$" represents the physical ease with which light enters a substance. More specifically, the smaller the absolute value of the real number term $\epsilon_R$ of the complex dielectric constant $\epsilon$, the more easily light enters the substance. The imaginary number term $\epsilon_i$ of the complex dielectric constant $\epsilon$ represents the extent which the light that enters the substance is absorbed by the substance. In short, the greater the imaginary term $\epsilon_i$ of the complex dielectric constant $\epsilon$ of material, the more apt light is to be absorbed. Therefore, in order to cause a substance to absorb light, it is desirable that the real number term $\epsilon_R$ of the complex dielectric constant $\epsilon(=\epsilon_R-i\epsilon_i)$ have a smaller absolute value and that the imaginary number term $\epsilon_i$ of the complex dielectric constant be larger.

Table 1 shows the complex refractive index "m" and the complex dielectric constant $\epsilon$ of each of copper and TiN in the form of real number and imaginary number terms in the case of a wavelength $\lambda$ of 0.52 μm, and Table 2 shows the complex refractive index "m" and the complex dielectric constant $\epsilon$ of each of copper and TiN in the form of real number and imaginary number terms in the case of a wavelength $\lambda$ of 1.32 μm.

TABLE 1

Wavelength $\lambda$ = 0.52 μm

|    | Complex Refractive Index | | Complex Dielectric Constant | |
|----|------|------|--------|------|
|    | n    | k    | $\epsilon_R$ | $\epsilon_I$ |
| Cu | 0.92 | 2.45 | −5.08  | 4.70 |
| TiN| 1.76 | 1.67 | 0.31   | 5.88 |

TABLE 2

Wavelength $\mu$ = 1.32 μm

|    | Complex Refractive Index | | Complex Dielectric Constant | |
|----|-------|------|---------|-------|
|    | n     | k    | $\epsilon_R$ | $\epsilon_I$ |
| Cu | 0.195 | 8.82 | −77.75  | 3.44  |
| TiN| 3.1   | 4.77 | −13.14  | 29.57 |

In a case where copper is used for a fuse and the copper fuse is blown by use of a laser beam having a wavelength of 1.32 μm, the light absorbing layer 4 may be formed from material whose real number item $\epsilon_R$ of the complex dielectric constant $\epsilon$ assumes an absolute value of smaller than 77.75 and whose imaginary number term $\epsilon_i$ of the complex dielectric constant e assumes a value of 3.44. For instance, the light absorbing layer includes TiN, or the like, shown in Table 1. The material used for the light absorbing layer is not limited to TiN, and any material may be used, so long as the material satisfies the above-described relationship.

Although in the foregoing description the light absorbing layer 4 is formed after formation of the copper wiring layer 3b through Damascene processes, the copper wiring layer 3b may be formed under another method. Under such a different method, the light absorbing layer 4 may be formed at the time of formation of the copper wiring layer 3b. As shown in FIG. 3, any method may be used, so long as a light absorbing layer having a light absorption coefficient which is higher than that of the copper wiring layer 3 is eventually formed on the copper wiring layer 3b.

Blowing of Fuse

Figure 4:
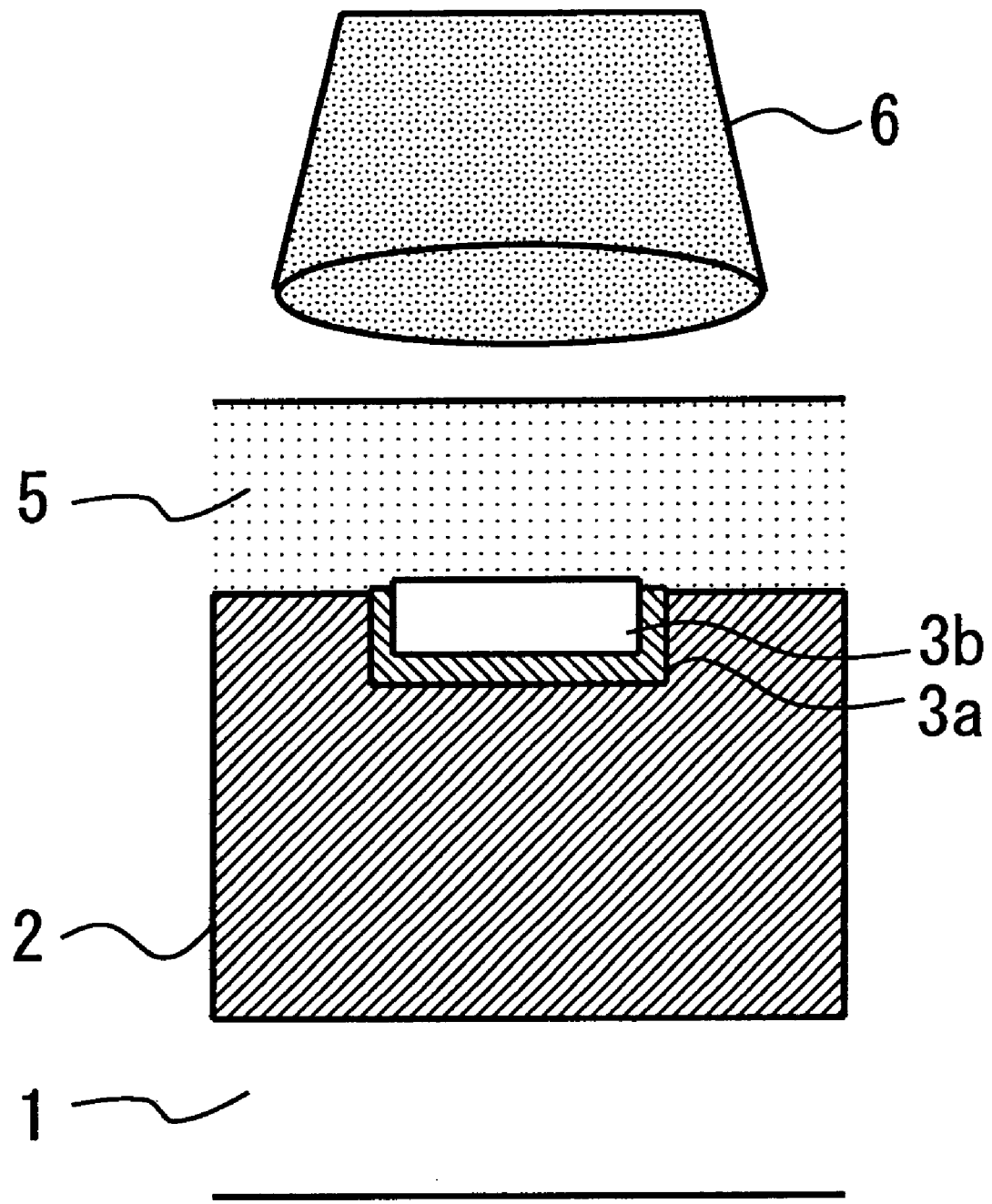
FIG. 4 shows the case that no light absorbing layer is present on the copper wiring layer.
Figure 14:
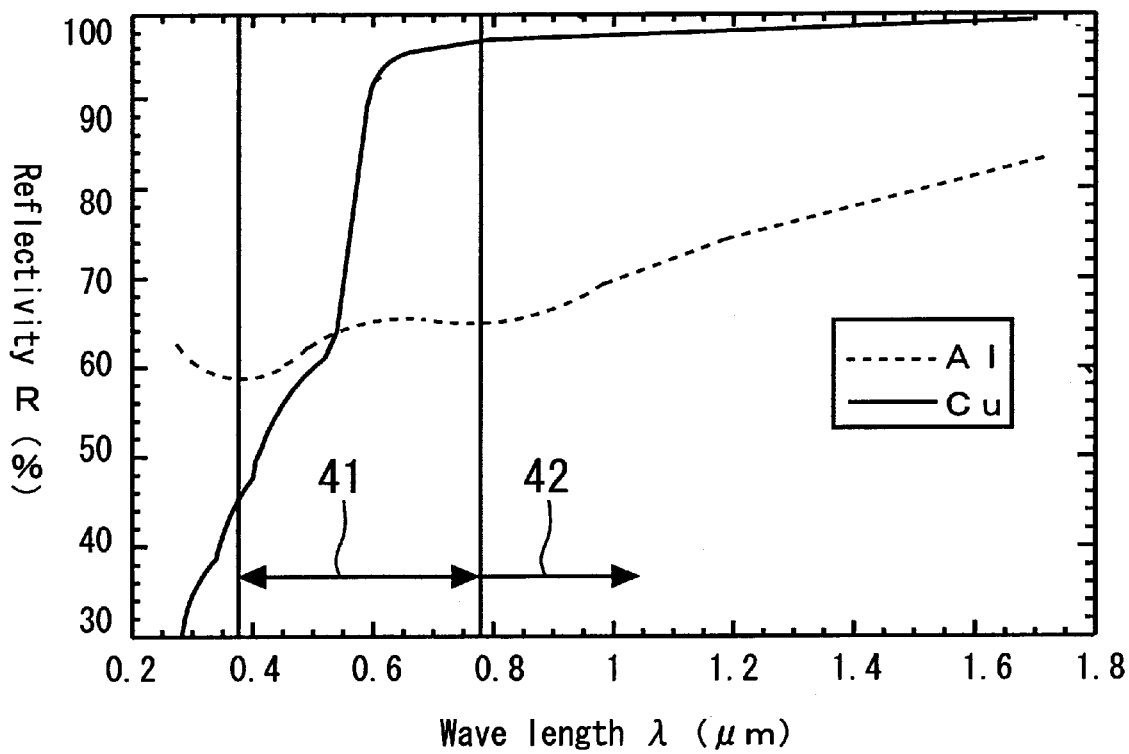
FIG. 14 is a graph showing the spectral light-absorption characteristic of copper and aluminum, wherein the vertical axis represents a reflectivity R(%) and the horizontal axis represents a wavelength $\lambda(\mu m)$.

An explanation will now be given of a case where a fuse is opened by use of a commonly-used laser beam of infrared wavelength. As shown in FIG. 14, the reflectivity R with respect to copper assumes a value of nearly 100% at an infrared wavelength. Consequently, as shown in FIG. 4, if no light absorbing layer is present on the copper wiring layer 3b, the radiated laser beam 6 is not absorbed by the copper wiring layer 3. In FIG. 3, the radiated laser beam 6 having an infrared wavelength is first absorbed by the light absorbing layer 4. In a case where TiN is used as the light absorbing layer 4, the reflectivity R of TiN is as low as several percent. Hence, the laser beam is well absorbed by the light absorbing layer 4. The thus-absorbed light is transmitted to the copper wiring layer 3b underlying the light absorbing layer 4 and further to the barrier metal layer 3a beneath the copper wiring layer 3b. The copper wiring layer 3b and the barrier metal layer 3a are fused by the thus-transmitted heat and are changed in phase from a solid to a liquid and further to a vapor. When the vapor pressure within the space formed around the fuse layer 3 exceeds a predetermined value, the second dielectric film 5 is blown, thereby blowing the copper wiring layer 3b and the barrier metal 3a, both of which are in a vapor phase. As a result, the copper fuse layer 3 is electrically disconnected. As mentioned previously, existence of the light absorbing layer 4 provided on the copper fuse layer 3 enables rupture of the copper fuse by use of the conventional laser of infrared wavelength that has widely been used.

As mentioned above, according to the embodiment 1, the light absorbing layer 4 whose light absorption coefficient is higher than that of the copper wiring layer 3b is provided on the copper fuse layer 3, whereby the light absorbed by the light absorbing layer 4 is transmitted to the copper wiring layer 3b underlying the light absorbing layer 4 and further to the barrier metal layer 3a beneath the copper wiring layer 3b, through thermal conduction. Accordingly, even in a case where a conventional laser beam which has widely been used and has a laser of infrared wavelength, a copper fuse can be blown.

Embodiment 2

The copper wiring pattern is expected to be used in a multilayer wiring device. In the embodiment 2, an explanation will be given of a case where the present invention is applied to a semiconductor device having a four-layer copper wiring pattern.

Device Configuration

Figure 5:
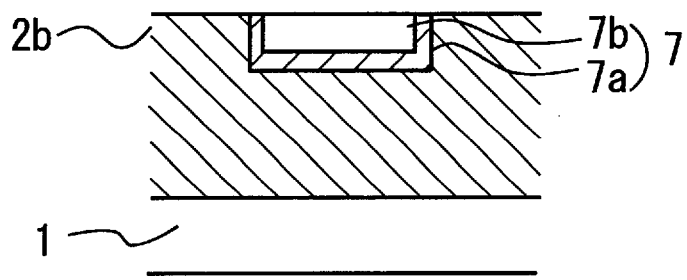
FIG. 5 shows a semiconductor device using a four-layer copper wiring pattern according to a second embodiment.
Figure 6:
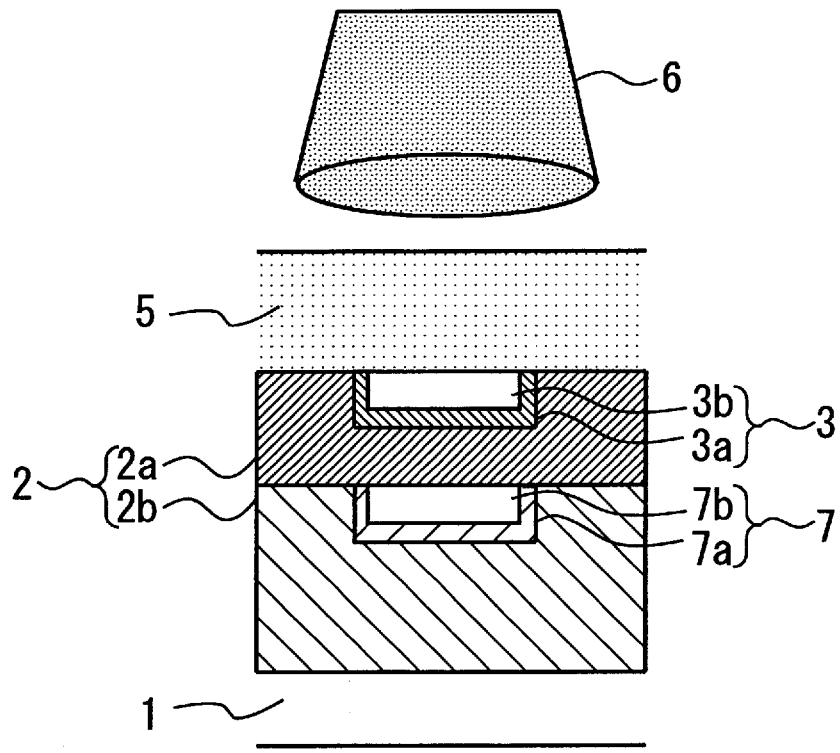
FIG. 6 shows a semiconductor device using a four-layer copper wiring pattern according to a second embodiment.

FIGS. 5 and 6 show a semiconductor device using a four-layer copper wiring pattern according to a embodiment 2. In FIGS. 5 and 6, the reference numerals that are the same as those shown in FIGS. 1 and 2 designate the same elements, and repetition of their explanations is omitted. As shown in FIG. 5, a guard layer 7 is formed on the silicon substrate 1 by way of the first dielectric film 2 (2b). The guard layer 7 comprises a barrier metal layer 7a and a copper wiring layer 7b formed thereon. As shown in FIG. 6, the fuse layer 3 is formed on the first dielectric film 2 (2a) by way of the first dielectric film 2 (2a). The fuse layer 3 comprises a barrier metal layer 3a and a copper wiring layer 3b formed thereon. The second dielectric film 5 is formed on the first dielectric film 1 (2a).

In the semiconductor device—comprising four wiring patterns; i.e., the first-layer silicon substrate 1, the second-layer first dielectric film 2 (2b), the third-layer first dielectric film 1 (2a), and the fourth-layer second dielectric film 5, the third-layer copper wiring layer 3 is used as the copper fuse layer 4 to be blown by exposure to the laser beam 6, because the above-described rupturing mechanism requires presence of the dielectric film on the copper fuse layer 3 and ease of rupture. The second-layer copper wiring layer is formed as the guard layer 7, so as to prevent damage to the areas of the silicon substrate 1 immediately below and around the fuse layer 3. The light absorption coefficient of the guard layer 7 is lower than that of the copper fuse layer 3 provided on the guard layer 7, for the purpose of preventing damage to the silicon substrate 1. Further, in terms of mitigation of damage to the silicon substrate 1, it is desirable that the light absorbing layer 4, which is employed in the embodiment 1, not be provided on the second-layer copper wiring layer 7 serving as the guard layer 7. In order to mitigate damage, the third-layer copper wiring layer 3 used as the copper fuse layer 3 is formed on the first dielectric film 2 (2a) on the second-layer copper wiring layer 7.

Blowing of Fuse

As mentioned above, since the guard layer 7 for preventing damage is provided below the fuse layer 3, there can be prevented damage to the silicon substrate 1, which would otherwise be caused when the wafer is exposed to the laser beam of the visible wavelength 41 whose absorption coefficient for the silicon substrate 1 is large. Further, adoption of a laser beam of visible wavelength 41 whose absorption coefficient for copper is high enables a fuse to be blown without use of the light absorbing layer 4 used in the embodiment 1. Accordingly, a film forming process for producing the light absorbing layer 4 through photolithography can be diminished. As mentioned above, the structure of the semiconductor device having the guard layer 7 according to the embodiment 2 enables prevention of damage to the silicon substrate 1, which would otherwise cause a problem at the time of exposure to the laser beam of visible wavelength. A copper fuse can be blown even by use of a laser of visible wavelength whose absorption coefficient for copper is high.

In the foregoing semiconductor device having the four-layer metal wiring pattern, in a case where materials of metal wiring patterns are mixedly present; i.e., the third and fourth layers formed from copper and the first and second wiring layers formed from aluminum are mixedly present, even if the first or second aluminum layer is formed beneath the third or fourth fuse layer, the aluminum layer acts as a guard layer relative to the fuse layer. Consequently, a similar advantageous result is yielded.

As mentioned above, according to the embodiment 2, the structure having the guard layer enables prevention of damage to the silicon substrate, which would otherwise cause a problem at the time of exposure to the laser beam of visible wavelength. Thus, the copper fuse can be opened even by use of a laser beam of visible wavelength whose absorption coefficient for copper is high.

Embodiment 3

Figure 7:
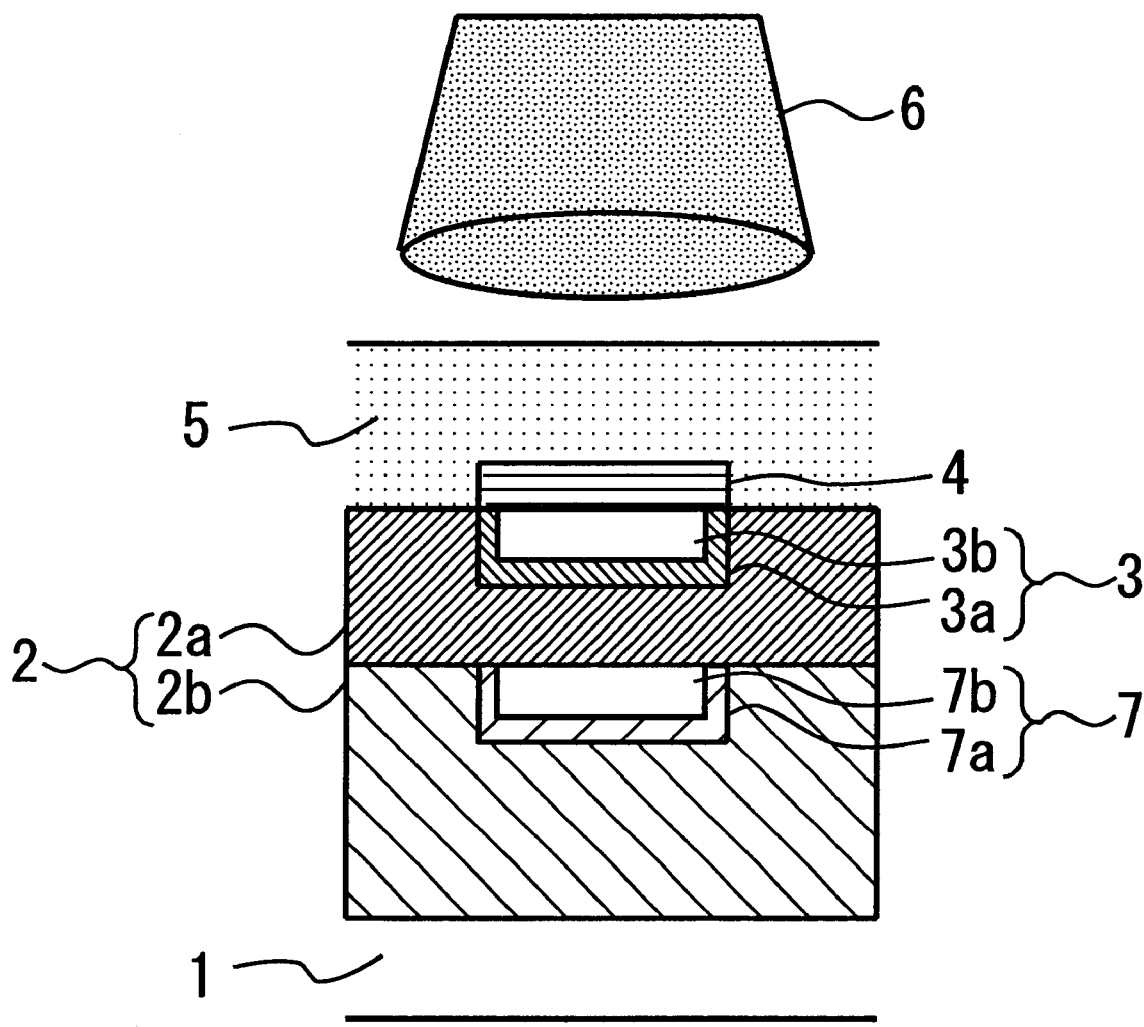
FIG. 7 shows the configuration of a semiconductor device according to a third embodiment.

FIG. 7 shows the configuration of a semiconductor device according to a embodiment 3. In FIG. 7, the reference numerals that are the same as those shown in FIGS. 1 through 6 designate the same elements, and repetition of their explanations is omitted here. In the embodiment 3, the light absorbing layer 4 is formed on the copper wiring layer (i.e., the first wiring layer) 3b according to the embodiment 2 shown in FIG. 5. In FIG. 7, the guard layer (i.e., the second wiring layer) 7 is formed on the silicon substrate 1 by way of the first dielectric film 2 (2b) serving as the first dielectric film. The guard layer 7 comprises the barrier metal layer 7a and the copper wiring layer 7b provided thereon. The fuse layer 3 is formed on the first dielectric film 2 (2b) by way of the first dielectric film 1 (2a) serving as the second dielectric film. The fuse layer 3 comprises the barrier metal layer 3a and the copper wiring layer 3b provided thereon. The light absorbing layer 4 is formed on the copper wiring layer 3b. The second dielectric film 5 serving as the third dielectric film is formed on the light absorption layer 4 and the first dielectric film 1 (2a). Material having high absorption coefficient for visible wavelength 41 and infrared wavelength 42, such as TiN, is used for the light absorbing layer 4. Use of material whose absorption coefficient for both ranges of wavelength enables the light absorbing layer 4 to absorb the laser beam 6 regardless of its wavelength. Subsequently, the energy absorbed by the light absorbing layer 4 is transmitted to the copper fuse layer 3 beneath the light absorbing layer 4 through heat conduction, thereby breaking the fuse layer 3. Further, since the guard layer 7 is provided below the copper fuse layer 3, there can be prevented damage to the silicon substrate 1, which would otherwise be caused at the time of exposure to a laser beam of visible wavelength 41.

As mentioned previously, according to the embodiment 3, use of material whose absorption coefficient for both the visible wavelength and the infrared wavelength enables the light absorbing layer 4 to absorb the laser beam regardless of the wavelength of the laser beam. The light absorbed by the light absorbing layer 4 is transmitted to the copper fuse layer 3 provided beneath the light absorbing layer 4 through heat conduction, thus enabling breakage of the fuse layer 3. Further, since the guard layer 7 is provided beneath the copper fuse layer 3, there can be prevented damage to the silicon substrate 1, which would otherwise be caused at the time of exposure to the laser beam of visible wavelength.

Embodiment 4

Figure 8:
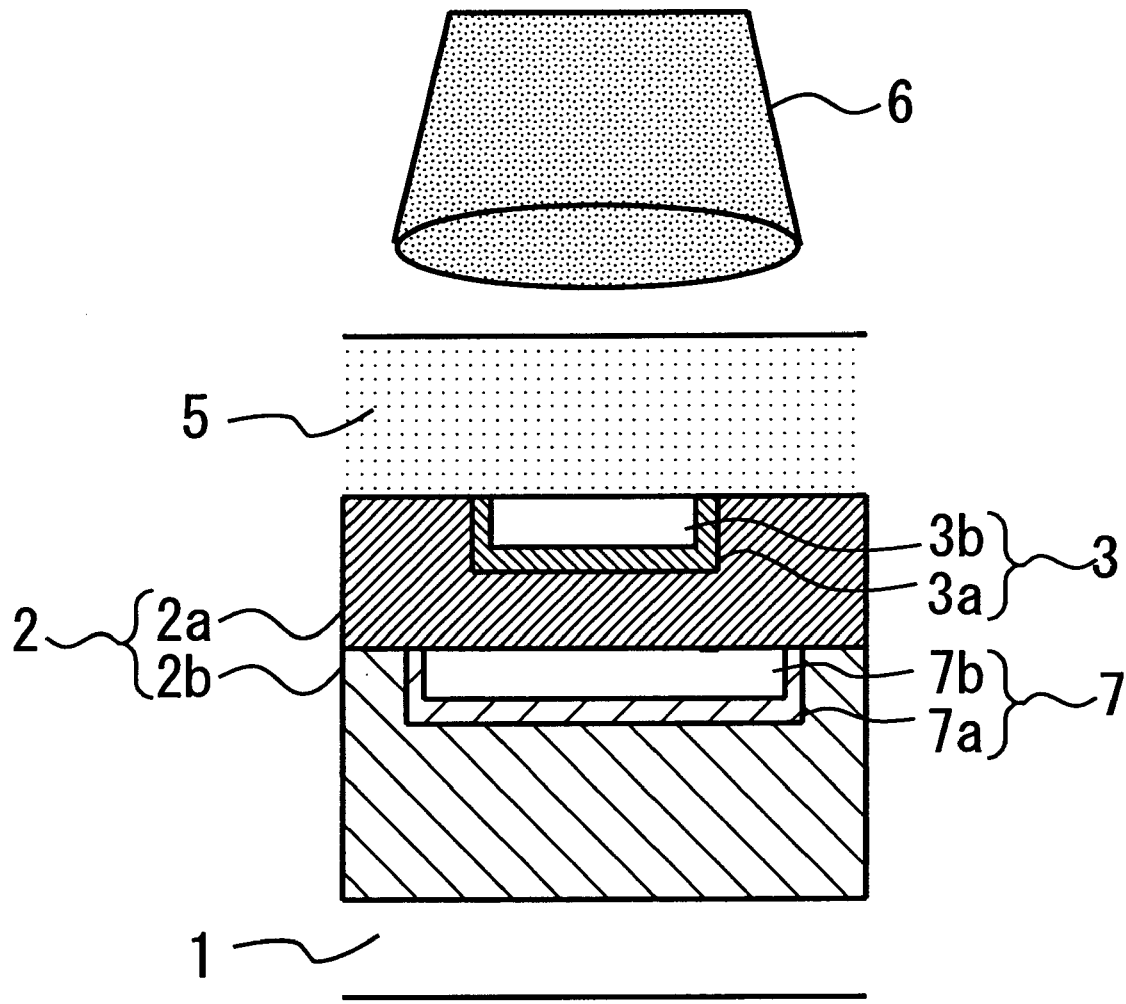
FIG. 8 shows the configuration of the semiconductor device according to a fourth embodiment.
Figure 9:
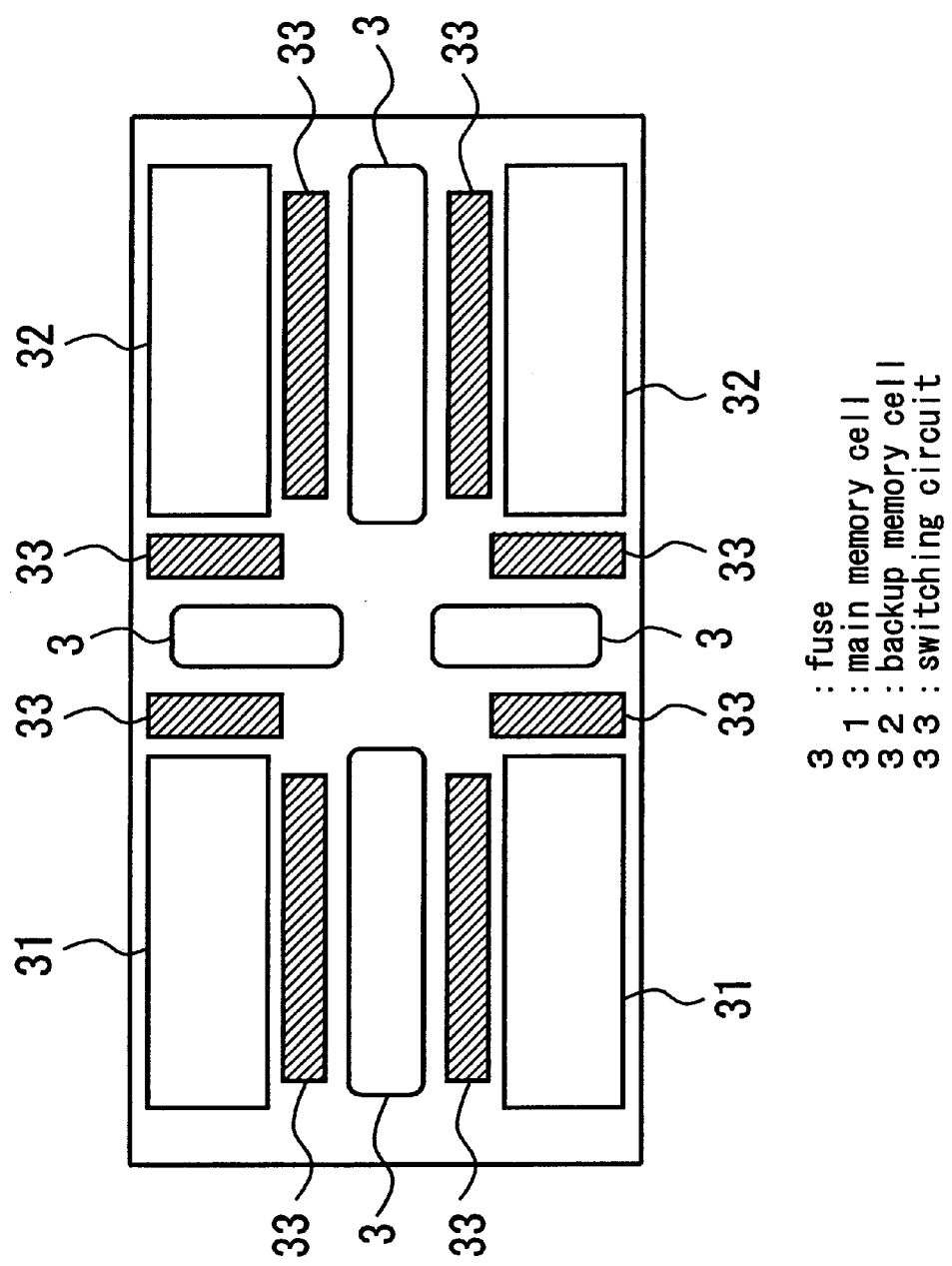
FIG. 9 shows a configuration of the semiconductor device having a spare cell memory.
Figure 10:
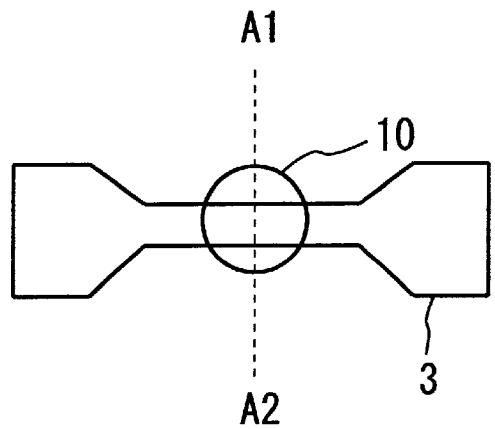
FIG. 10 is a plan view of a fuse.
Figure 11:
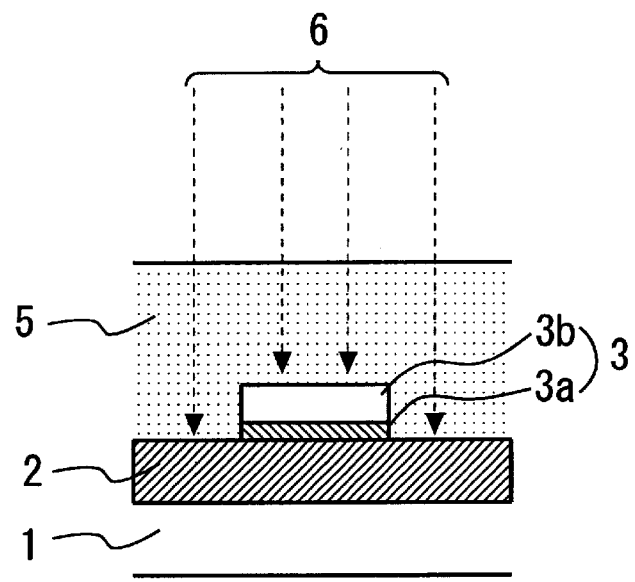
FIG. 11 is a cross-sectional view of the fuse in its transverse direction
Figure 12:
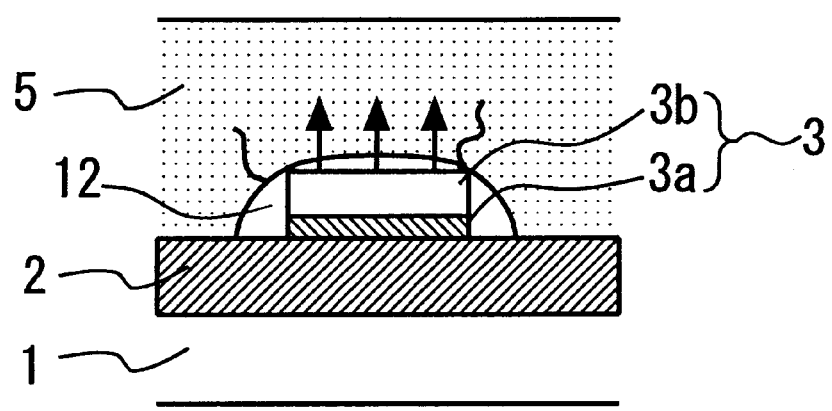
FIG. 12 shows that as a result of the changes in phase of the fuse layer the bottom of the second dielectric film is raised by the vapor pressure stemming from evaporation of the fuse layer, thereby forming a space.
Figure 13:
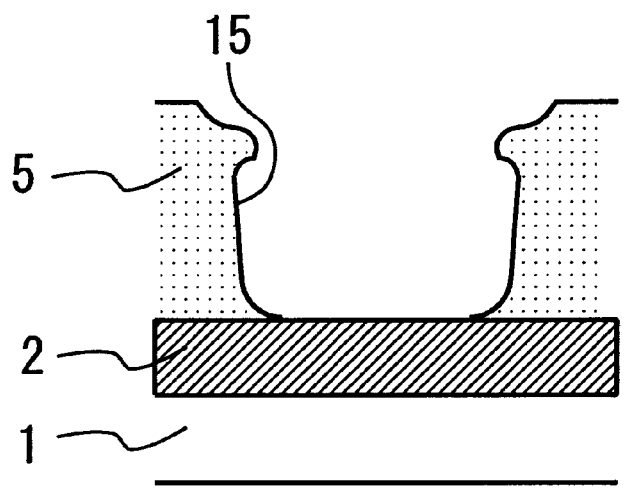
FIG. 13 shows that when the vapor pressure within the space exceeds a predetermined value, the fuse layer is opened, the area of the second dielectric film situated above the fuse layer is blown, thus forming a blow pocket.

FIG. 8 shows the configuration of the semiconductor device according to a embodiment 4. In FIG. 8, the reference numerals that are the same as those shown in FIGS. 1 through 7 designate the same elements, and repetition of their explanations is omitted here. In the embodiment 4, the guard layer 7 according to the embodiment 2 shown in FIG. 6 is wider than the fuse layer 3.

In FIG. 8, the guard layer 7 is formed on the silicon substrate 1 by way of the first dielectric film 2 (2b). The guard layer 7 comprises the barrier metal layer 7a and the copper wiring layer 7b formed thereon. The fuse layer 3 is formed on the first dielectric film 2 (2b) by way of the first dielectric film 1 (2a). The guard layer 7 is formed so as to be wider than the copper fuse layer 3. The diffracting pattern of the laser beam 6 radiated on the copper fuse layer 3 is changed in a complicated manner by the cross-sectional shape of the copper fuse layer 3. Even when the diffracting pattern of the laser beam 6 is changed by variations in the cross-sectional shape of the copper fuse layer 3 formed through Damascene processes, there can be prevented damage to the area surrounding the copper fuse layer 3. The copper fuse layer 3 comprises the barrier metal layer 3a and the copper wiring layer 3b formed thereon. The second dielectric film 5 is formed on the first dielectric film 1 (2a).

As mentioned above, according to the embodiment 4, since the guard layer is formed so as to be wider than the copper fuse layer, there can be prevented damage to the area surrounding the copper fuse layer, which would otherwise be caused when the diffracting pattern of the laser beam radiated on the copper fuse layer is changed by variations in the cross-sectional shape of the copper fuse layer.

As has been described above, there can be provided the semiconductor device according to the present invention which has a structure for mitigating damage to the silicon substrate underneath the copper fuse, which is caused by the laser beam irradiated to blow the copper fuse.

Here, the semiconductor device may further comprise a third dielectric film formed on the second dielectric film, wherein the third dielectric film has a light absorbing layer located on the first wiring layer, the light absorbing layer being formed such that the absolute value of a real number term of a complex dielectric constant of the light absorbing layer is smaller than the absolute value of a real number term of a complex dielectric constant of the first wiring layer and such that an imaginary number term of the complex dielectric constant of the light absorbing layer is greater than an imaginary number term of the complex dielectric constant of the first wiring layer.

In the semiconductor device, the second wiring layer may be wider than the first wiring layer.

In the semiconductor device, the first wiring layer may be a copper wiring layer, and the second wiring layer may be an aluminum wiring layer.

The present invention has been described in detail with respect to various embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

The entire disclosure of Japanese Patent Application No. 11-10647 filed on Jan. 19, 1999 including specification, claims, drawings and summary are incorporated herein by reference in its entirety.

What is claimed is:

1. A semiconductor device comprising:

a semiconductor substrate;

a first dielectric film formed on said semiconductor substrate; and a second dielectric film formed on said first dielectric film, wherein said first dielectric film has a fuse layer in a part of the area on said first dielectric film, the fuse layer including a copper wiring layer and the second dielectric film has a light absorbing layer located on the fuse layer, and the light absorbing layer is formed such that the absolute value of a real number term of a complex dielectric constant of the light absorbing layer is smaller than the absolute value of a real number term of a complex dielectric constant of the copper wiring layer and such that an imaginary number term of the complex dielectric constant of the light absorbing layer is greater than an imaginary number term of a complex dielectric constant of the copper wiring layer.

2. A semiconductor device comprising:

a semiconductor substrate;

a first dielectric film formed on said semiconductor substrate;

a second dielectric film formed on said first dielectric film and a third dielectric film formed on said second dielectric film, wherein said second dielectric film includes a first wiring layer in a portion of said second dielectric film, the first wiring layer having a predetermined light absorption coefficients said first dielectric film has a second wiring layer located beneath the first wiring layer, the second wiring layer having a light absorption coefficient which is not great than a light absorption coefficient of the first wiring layer, and said third dielectric film has a light absorbing layer located on the first wiring layer, the light absorbing layer being formed such that the absolute value of a real number term of a complex dielectric constant of the light absorbing layer is smaller than the absolute value of a real number term of a complex dielectric constant of the first wiring layer and such that an imaginary number term of the complex dielectric constant of the light absorbing layer is greater than an imaginary number term of the complex dielectric constant of the first wiring layer.

3. The semiconductor device according to claim 2, wherein the first wiring layer is a copper wiring layer, and the second wiring layer is an aluminum wiring layer.

4. The semiconductor device according to claim 2, wherein the second wiring layer is wider than the first wiring layer.

5. The semiconductor device according to claim 4, wherein the first wiring layer is a copper wiring layer, and the second wiring layer is an aluminum wiring layer.

6. The semiconductor device according to claim 2, wherein the first wiring layer is a copper wiring layer, and the second wiring layer is an aluminum wiring layer.

* * * * *